(12) United States Patent
Miller et al.

(10) Patent No.: US 11,367,810 B2
(45) Date of Patent: Jun. 21, 2022

(54) LIGHT-ALTERING PARTICLE ARRANGEMENTS FOR LIGHT-EMITTING DEVICES

(71) Applicant: CreeLED, Inc., Durham, NC (US)

(72) Inventors: Derek Miller, Raleigh, NC (US); Colin Blakely, Raleigh, NC (US)

(73) Assignee: CREELED, INC., Durham, NC (US)

( * ) Notice: Subject to any disclaimer, the term of this patent is extended or adjusted under 35 U.S.C. 154(b) by 0 days.

(21) Appl. No.: 16/993,470

(22) Filed: Aug. 14, 2020

(65) Prior Publication Data

US 2022/0052232 A1 Feb. 17, 2022

(51) Int. Cl.
H01L 33/50 (2010.01)

(52) U.S. Cl.
CPC .... H01L 33/502 (2013.01); *H01L 2933/0041* (2013.01)

(58) Field of Classification Search
CPC ............ H01L 33/502; H01L 2933/0041
See application file for complete search history.

(56) References Cited

U.S. PATENT DOCUMENTS

| | | | |
|---|---|---|---|
| 7,999,283 B2 | 8/2011 | Chakraborty et al. | |
| 8,415,692 B2 | 4/2013 | Le Toquin | |
| 8,866,169 B2 | 10/2014 | Emerson et al. | |
| 8,957,435 B2 | 2/2015 | Emerson et al. | |
| 9,053,958 B2 * | 6/2015 | Donofrio | ............ H01L 25/0753 |
| 9,070,850 B2 | 6/2015 | Keller et al. | |
| 9,461,201 B2 | 10/2016 | Heikman et al. | |
| 9,887,327 B2 | 2/2018 | Reiherzer et al. | |
| 10,290,777 B2 | 5/2019 | Andrews et al. | |
| 10,468,565 B2 | 11/2019 | Pun et al. | |
| 2005/0093430 A1 | 5/2005 | Ibbetson et al. | |
| 2009/0050911 A1 | 2/2009 | Chakraborty | |
| 2011/0001151 A1* | 1/2011 | Le Toquin | .............. H01L 33/44 257/98 |
| 2015/0207045 A1* | 7/2015 | Wada | ................... H01L 25/0753 257/88 |
| 2016/0093780 A1* | 3/2016 | Beppu | ................. H01L 21/3213 257/98 |
| 2017/0098746 A1 | 4/2017 | Bergmann et al. | |

(Continued)

*Primary Examiner* — Jonathan Han
(74) *Attorney, Agent, or Firm* — Withrow & Terranova, P.L.L.C.

(57) ABSTRACT

Solid-state lighting devices including light-emitting diodes (LEDs), and more particularly LED devices with light-altering particle arrangements are disclosed. An LED device may include an LED chip with a light-altering material arranged to redirect light in a desired emission direction. The light-altering material may include light-altering particles with a median particle size that is determined based on a wavelength of light provided by the LED chip. Such light-altering particles may be arranged proximate sidewalls of the LED chip to redirect lateral emissions. LED devices may further include lumiphoric materials and other light-altering particles arranged proximate the lumiphoric materials with a median particle size that is determined based on a wavelength of light provided by the lumiphoric materials. By selectively arranging different light-altering particles in different areas of an LED device based on what wavelengths of light are most concentrated, the amount of overall light redirected may be increased, thereby improving efficiency.

27 Claims, 4 Drawing Sheets

(56) References Cited

U.S. PATENT DOCUMENTS

2017/0170371 A1* 6/2017 Iwata .................... H01L 33/504
2018/0033924 A1* 2/2018 Andrews ............... H01L 33/507
2019/0326484 A1 10/2019 Welch et al.

* cited by examiner

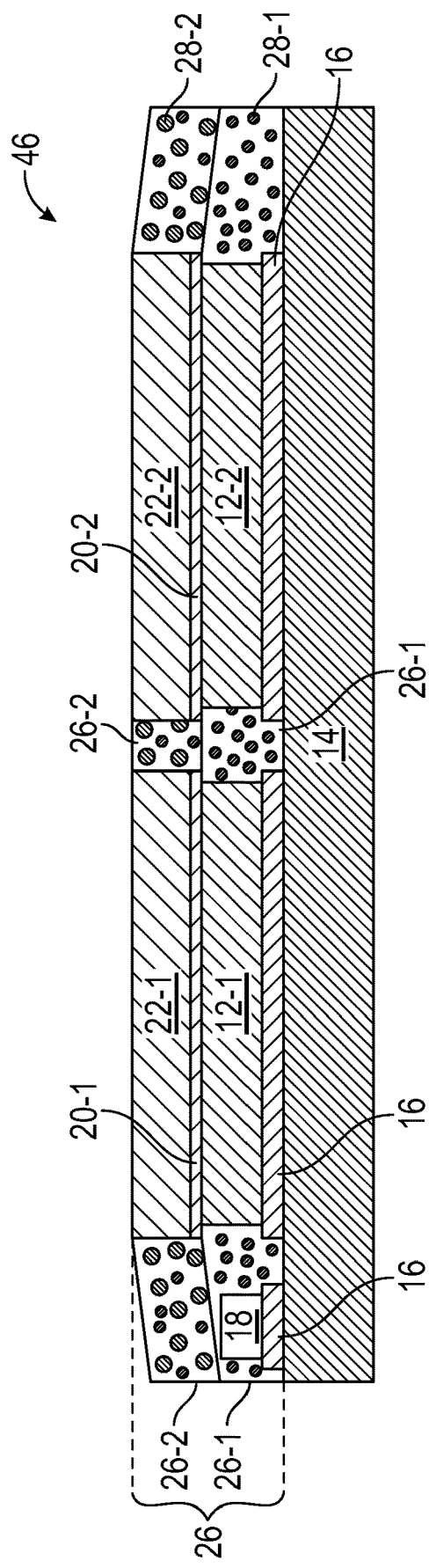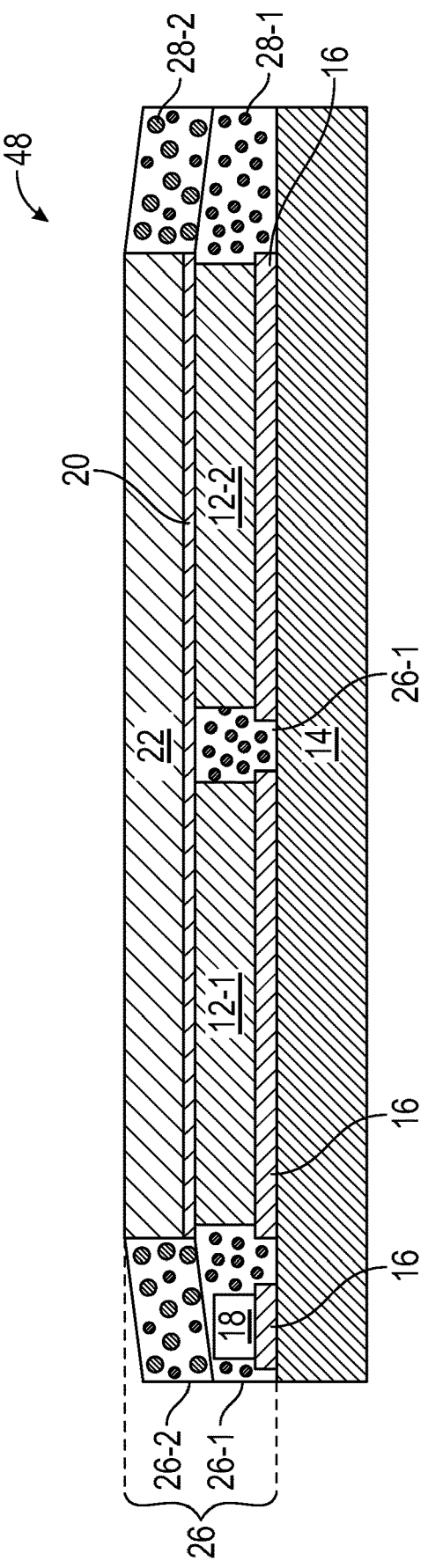

LIGHT-ALTERING PARTICLE ARRANGEMENTS FOR LIGHT-EMITTING DEVICES

FIELD OF THE DISCLOSURE

The present disclosure relates to solid-state lighting devices including light-emitting diodes (LEDs), and more particularly to packaged LED devices with light-altering particle arrangements.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages have been developed that can provide mechanical support, electrical connections, and encapsulation for LED emitters. Light emissions that exit surfaces of LED emitters may then interact with elements or surfaces of corresponding LED packages, thereby increasing opportunities for light loss. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to light-altering particle arrangements in LED devices. An LED device or package may include one or more LED chips on a submount with a light-altering material arranged to redirect light in a desired emission direction with increased efficiency. The light-altering material may include light-altering particles with a median particle size that is determined based on a wavelength of light emissions provided by the one or more LED chips in order to improve an amount of light that is redirected. Such light-altering particles may be arranged proximate sidewalls of the LED chips to redirect lateral emissions. LED devices may further include lumiphoric materials arranged in a light-receiving path of the LED chips and the light-altering material may further include other light-altering particles arranged proximate the lumiphoric materials with a median particle size that is determined based on a wavelength of light provided by the lumiphoric material. By selectively arranging different light-altering particles in different areas of an LED package based on what wavelengths of light are most concentrated, the amount of overall light redirected in a desired direction may be increased, thereby improving efficiency.

In one aspect, an LED package comprises: a submount; at least one LED chip on the submount, wherein the at least one LED chip comprises a first face mounted to the submount, a second face that generally opposes the first face, and a sidewall between the first face and the second face; a lumiphoric material on the second face of the at least one LED chip; and a light-altering material on the submount and arranged around a perimeter of the at least one LED chip, the light-altering material comprising: a first sub-region arranged along the sidewall of the at least one LED chip, the first sub-region comprising a first plurality of light-altering particles with a first median particle size; and a second sub-region arranged above the first sub-region, the second sub-region comprising a second plurality of light-altering particles with a second median particle size that is larger than the first median particle size. In certain embodiments, the first median particle size is in a range from 130 nanometers (nm) to 170 nm. The second median particle size may be in a range from 240 nm to 350 nm, or in a range from 190 m to 240 nm. In certain embodiments, the second sub-region further comprises a third plurality of light-altering particles that have the first median particle size. In certain embodiments, the second sub-region further comprises a third plurality of light-altering particles with a third median particle size that is different than the first median particle size and the second median particle size. The at least one LED chip may comprise a first height measured in a direction perpendicular to the submount and the light-altering material may comprise a second height measured in a direction perpendicular to the submount, and the second height is no more than two times greater than the first height. In certain embodiments, the second height is no more than 1.3 times greater than the first height. In certain embodiments, the second sub-region is arranged along a peripheral edge of the lumiphoric material. In certain embodiments, the lumiphoric material is part of a wavelength conversion element that includes a light-transmissive superstrate. Peripheral edges of the lumiphoric material may be at least partially embedded within the light-altering material. In certain embodiments, the first median particle size differs from the second median particle size by at least 40 nm, or in a range from 40 nm to 100 nm. In certain embodiments, the at least one LED chip comprises a first LED chip and a second LED chip and a portion of the first sub-region is arranged between the first LED chip and the second LED chip. In certain embodiments, the lumiphoric material extends over the first LED chip and the second LED chip. In certain embodiments, the lumiphoric material is a first lumiphoric material that is arranged over the first LED chip and the LED package further comprises a second lumiphoric material that is arranged over the second LED chip, and a portion of the second sub-region is arranged between the first lumiphoric material and the second lumiphoric material.

In another aspect, an LED package comprises: a submount; at least one LED chip on the submount, wherein the at least one LED chip comprises a first face mounted to the submount, a second face that generally opposes the first face, and a sidewall between the first face and the second face; and a light-altering material on the submount and arranged around a perimeter of the at least one LED chip to form a reflector for the sidewall of the at least one LED chip, the light-altering material comprising a plurality of light-altering particles with a median particle size that is determined based on a peak wavelength of light emissions provided by the at least one LED chip. In certain embodiments, the median particle size is in a range from 130 nm to 170 nm. In certain embodiments, the at least one LED chip comprises a first height measured in a direction perpendicular to the submount and the light-altering material comprises a second height measured in a direction perpendicular to the submount, and the second height is no more than two times greater than the first height. In certain embodiments, the LED package further comprises a lumiphoric material on the second face of the at least one LED chip such that peripheral edges of the lumiphoric material are at least partially embedded within the light-altering material. In certain embodiments, the LED package further comprises a lumiphoric material on the second face of the at least one LED chip and on the light-altering material such that at least a portion of the light-altering material is between the lumiphoric material and the submount. In certain embodiments, the LED package further comprises a lumiphoric material on the second face of the at least one LED chip and on a surface of the submount that is adjacent the at least one LED chip such that at least a portion of the lumiphoric material is between the light-altering material and the submount.

In another aspect, a method comprises: providing at least one LED chip on a submount, the at least one LED chip comprising a first face mounted to the submount, a second face that generally opposes the first face, and a sidewall between the first face and the second face; providing a lumiphoric material on the second face of the at least one LED chip; and forming a light-altering material on the submount and arranged along the sidewall of the at least one LED chip, the light-altering material comprising a plurality of first light-altering particles with a first median particle size that is determined based on a peak wavelength of light emissions provided by the at least one LED chip. In certain embodiments, forming the light-altering material comprises forming a first sub-region of the light-altering material along the sidewall of the at least one LED chip and forming a second sub-region of the light-altering material on the first sub-region. In certain embodiments, the first sub-region comprises the first plurality of light-altering particles and the second sub-region comprises a second plurality of light-altering particles with a second median particle size that is determined based on a peak wavelength of light emissions provided by the lumiphoric material. In certain embodiments, the first median particle size differs from the second median particle size in a range from 40 nm to 100 nm. In certain embodiments, the first sub-region and the second sub-region are formed by different dispensing steps and the first sub-region and the second sub-region are cured at the same time. In certain embodiments, the first sub-region and the second sub-region are formed by different dispensing steps and the first sub-region is cured before the second sub-region is formed.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 10 is a cross-sectional view of an LED package that includes an arrangement of light-altering material with light-altering particles on a submount with first and second LED chips.

FIG. 11 is a cross-sectional view of an LED package that is similar to the LED package of FIG. 10, except that a single lumiphoric material and superstrate are provided over the first and second LED chips.

DETAILED DESCRIPTION

Figure 1:
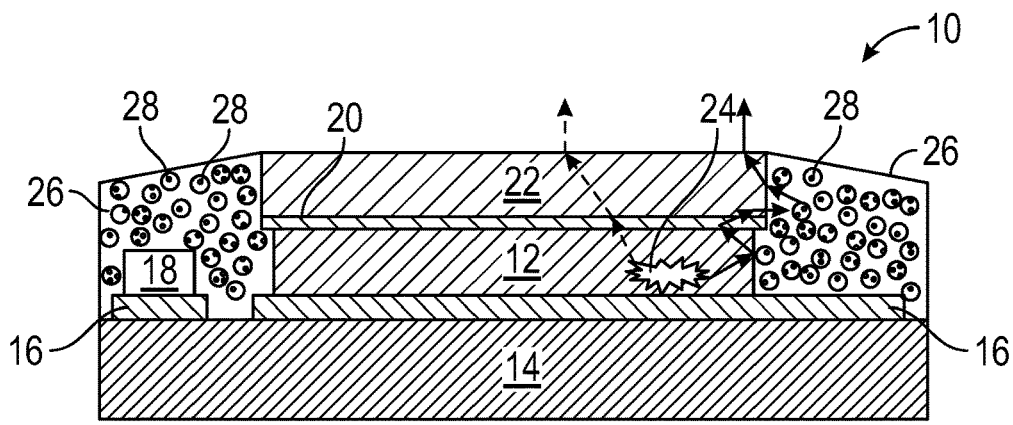
FIG. 1 is a cross-sectional view of a light-emitting diode (LED) package that includes an LED chip on a submount with an arrangement of a lumiphoric material and a light-altering material.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to light-altering particle arrangements in LED devices. An LED device or package may include one or more LED chips on a submount with a light-altering material arranged to redirect light in a desired emission direction with increased efficiency. The light-altering material may include light-altering particles with a median particle size that is determined based on a wavelength of light emissions provided by the one or more LED chips in order to improve an amount of light that is redirected. Such light-altering particles may be arranged proximate sidewalls of the LED chips to redirect lateral emissions. LED devices may further include lumiphoric materials arranged in a light-receiving path of the LED chips, and the light-altering material may further include other light-altering particles arranged proximate the lumiphoric materials with a median particle size that is determined based on a wavelength of light provided by the lumiphoric material. By selectively arranging different light-altering particles in different areas of an LED package based on what wavelengths of light are most concentrated, the amount of overall light redirected in a desired direction may be increased, thereby improving efficiency.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate"

as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be patterned to enhance light extraction as described in commonly-assigned U.S. Patent Application Publication No. 2019/0326484 entitled "Semiconductor Light Emitting Devices Including Superstrates With Patterned Surfaces" which is hereby incorporated by reference herein. Superstrates may also be configured as described in commonly-assigned U.S. Pat. No. 10,290,777, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents, which are hereby incorporated by reference herein: U.S. Pat. Nos. 8,866,169; 9,070,850; 9,887,327; and 10,468,565.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a leadframe. Light-altering materials, maybe arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain aspects, light-altering materials may be provided in a preformed sheet or layer that includes light-altering particles suspended in a binder. For example, light-altering particles may be suspended in a binder of silicone that is not fully cured to provide the preformed sheet of light-altering materials. A desired thickness or height of the preformed sheet may be provided by moving a doctor blade or the like across the sheet. The preformed sheet may then be positioned on and subsequently formed around an LED chip and/or a wavelength conversion element that is on the LED chip. For example the preformed sheet may be laminated around the LED chip and/or wavelength conversion element and then the performed sheet may be fully cured in place. One or more portions of the preformed sheet may then be removed from a primary light-emitting face of the LED chip and/or wavelength conversion element. In this manner, light-altering materials may be formed along peripheral edges or sidewalls of the LED chip and wavelength conversion element with thicknesses not previously possible with conventional dispensing techniques typically used to form light-altering materials. Additionally, light-altering materials may be provided without needing conventional submounts or lead frames as support for conventional dispensing and/or molding techniques. In this regard, LED devices with light-altering materials may be provided with reduced footprints suitable for closely-spaced LED arrangements.

FIG. 1 is a cross-sectional view of an LED package 10 that includes an LED chip 12 on a submount 14. The LED chip 12 may be mounted to and electrically coupled to one or more electrical traces 16 that are provided on the submount 14. In certain embodiments, the LED chip 12 may be flip-chip mounted such that an anode and a cathode of the LED chip 12 are mounted to and electrically coupled with different ones of the electrical traces 16. In the view of FIG. 1, only a single electrical trace 16 is shown, but it is understood any number of electrical traces 16 may be present without deviating from the principles disclosed. Additionally, an electrical overstress device 18 may be mounted to and electrically coupled to one or more of the electrical traces 16 to provide protection from electrical overstress events where currents or voltages exceed maximum ratings for the LED chip. The electrical overstress device 18 may comprise an electrostatic discharge (ESD) chip such as a Zener diode. The LED package 10 may further include a lumiphoric material 20 on the LED chip 12. In certain embodiments, the lumiphoric material 20 may be supported by a superstrate 22 that comprises a light-transmissive material such as glass, sapphire, or the like. The combination of the lumiphoric material 20 and the superstrate 22, when present, may be referred to as a wavelength conversion element. In embodiments where the superstrate 22 is not present, the lumiphoric material 20 may be referred to as a wavelength conversion element and may comprise a coating formed on the LED chip 12 or a pre-formed structure that is attached to the LED chip 12.

Light 24 that is generated by the active region of the LED chip 12 may be omnidirectional in nature and LED packages are typically designed with features that are arranged to redirect light from the active region toward a desired emission direction. For example, a desired emission direction for the LED package 10 of FIG. 1 may be perpendicular with an interface between the LED chip 12 and the submount 14 or the electrical traces 16. For illustrative purposes, a portion of light 24 generated within the LED chip 12 is shown in FIG. 1. Certain portions of the light 24 as represented by the dashed arrows may traverse through the lumiphoric material 20, the superstrate 22 and escape the LED package 10 in a desired emission direction. Each of the LED chip 12, the lumiphoric material 20, the superstrate 22, and the external environment (e.g., air) above the superstrate 22 may have a different index of refraction. As such, light 24 traversing through each interface may refract along a different angle according to the principles of Snell's law. As light 24 is generated omnidirectionally by the LED chip 12 and must pass through multiple interfaces within the LED package 10, not all light 24 may ultimately emit from the LED package 10 in the desired emission direction. As illustrated by the solid arrows in FIG. 1, some light 24 may traverse laterally within the LED chip 12 and may refract laterally within the LED package 10, such as at an interface between the LED chip 12 and the lumiphoric material 20. In this regard, a light-altering material 26 can be arranged around the LED chip 12 to reflect or otherwise redirect light 24 toward the desired emission direction. In various configurations, the light-altering material 26 may comprise light-altering particles 28 such as one or more of fused silica, fumed silica, zinc oxides, tantalum oxides, zirconium oxides, niobium oxides, yttrium oxides, alumina, glass beads, and $TiO_2$ that are suspended or embedded within a binder such as silicone or epoxy. In many applications, the light-altering material 26, including the light-altering particles 28 are selected to reflect broad spectrum white light including photons ranging in wavelength from 400 nm to 700 nm.

While light-altering materials configured to reflect broad spectrum white light are effective at reflecting and redirecting light in desired emission directions or patterns, some light may still be lost to internal reflections and absorption within LED packages. According to embodiments disclosed herein, light-altering particle arrangements within light-altering materials are provided that target scattering and redirecting of specific wavelengths in specific areas within LED packages to realize increased light extraction efficiency. In the context of the present disclosure, light-altering particles can scatter light by one or more of reflection, refraction and diffraction. The manner in which light-altering particles interact with light at a given wavelength or in a given wavelength range may be related to both the particle size and the index of refraction of the light-altering particles. In this regard, light-altering particles that are more effective at redirecting light of a peak wavelength of the LED chip may be provided around perimeter edges of the LED chip while light-altering particles that are more effective at redirecting other colors of light, such as converted light from lumiphoric materials, may be provided in other locations. By selectively tailoring different light-altering particles in different areas of an LED package that receive different wavelengths of light, the amount of overall light redirected in a desired direction may be increased, thereby improving efficiency. In order to effectively redirect light as a de facto reflector around a perimeter of an LED chip, the light-altering particles should have a sufficient loading that reflects and redirects light without allowing significant amounts of light to pass through the light-altering material. Accordingly, a volume percent of the light-altering particles to the overall light-altering material may be in a range from 5% to 41% in certain embodiments, although higher volume percentages are possible. For the same loading of light-altering particles, a volume percent of the binder to the overall light-altering material may be in a range as high as 95% (corresponding to the lower volume percent of light-altering particles) to 58% (corresponding to the higher volume percent of light-altering particles). It is noted that small amounts of additional materials may also be present in the light-altering materials. Lower ratios or amounts of light-altering particles may allow light to predominantly pass through with some scattering and such lower ratios are typically used in other applications, such as for diffuse lenses that are placed in desired light paths for LED packages.

According to the principles of the present disclosure, increased brightness of LEDs may be realized, especially for LED emissions configured for cool white applications and single color applications with narrow spectral emission. In such applications, targeted light-scattering particles may effectively increase light emissions that correspond to light wavelengths generated by the LED chips. The principles of the present disclosure may also increase brightness for other applications, such as neutral white and warm white applications.

Figure 2:
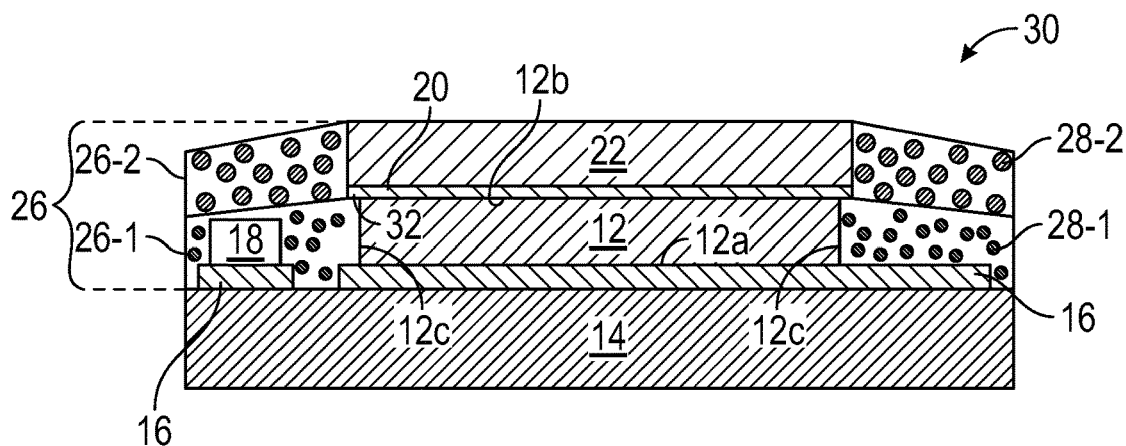
FIG. 2 is a cross-sectional view of an LED package where the light-altering material is divided into different regions with different light-altering particles that are configured to redirect different wavelengths of light with increased efficiency.

FIG. 2 is a cross-sectional view of an LED package 30 where the light-altering material 26 is divided into different regions that are configured to redirect different wavelengths of light with increased efficiency. Other elements of the LED package 30 may be similar to the LED package 10 of FIG. 1. As illustrated, the LED chip 12 includes a first face 12a that is mounted to the submount 14, a second face 12b that generally opposes the first face 12a such that the second face 12b is a primary emission face of the LED chip 12, and sidewalls 12c therebetween. As previously described, when electrically activated, some light of a first peak wavelength that is generated by the LED chip 12 may propagate laterally through one or more of the sidewalls 12c and away from a desired emission direction and some light of a second peak wavelength that is converted by the lumiphoric material 20 may also propagate laterally away from the desired emission direction.

In order to improve light-redirecting efficiency, the light-altering material 26 includes a first sub-region 26-1 and a second sub-region 26-2 that are configured differently from one another based on the wavelength of light that predominantly interacts with the particular sub-region 26-1, 26-2. By way of example, the first sub-region 26-1 is arranged along the sidewalls 12c of the LED chip 12 and includes a first plurality of light-altering particles 28-1 that are configured with a median particle size and an index of refraction that are tailored to increase light redirection of light having the first peak wavelength. The second sub-region 26-2 is arranged above the first sub-region 26-1 such that the second sub-region 26-2 is arranged along peripheral edges of the wavelength conversion element formed by the lumiphoric material 20 and the superstrate 22 where light of the second peak wavelength may be more prevalent. In this regard, the second sub-region 26-2 includes a second plurality of light-altering particles 28-2 that are configured with a median particle size and an index of refraction that are tailored to increase light redirection of light having the second peak wavelength. By targeting specific peak wavelengths that are more prevalent in different areas of the light-altering material 26, an increased efficiency of light emission in a desired direction from the LED package 30 may be realized.

In certain embodiments, the first and second light-altering particles 28-1, 28-2 may comprise different particle size distributions that more effectively redirect light of different peak wavelengths. By applying general principles of Mie scattering theory in combination with practical experimental results, different median particle sizes for each of the light-altering particles 28-1, 28-2 may be determined that are targeted to more effectively re-direct light of different wavelengths. A median particle size may also be referred to as a D50 value. By way of example, if the first peak wavelength of the LED chip 12 is configured to be 450 nm (e.g. blue), or in a range from 440 nm to 470 nm, the median particle size of the first plurality of light-altering particles 28-1 may be set at 150 nm, or provided in a range from 130 nm to 170 nm. If the second peak wavelength of light from the lumiphoric material 20 is configured to be 640 nm (e.g., red), or in a range from 620 nm to 680 nm, the median particle size of the second plurality of light-altering particles 28-2 may be set at 260 nm, or provided in a range from 240 nm to 350 nm. Rather than targeting a specific peak wavelength of light from the lumiphoric material 20, the second plurality of light-altering particles 28-2 may alternatively be configured to generally redirect a broad spectrum of light (e.g., white) that may include portions of light from the LED chip 12 and one or more wavelengths of light provided by the lumiphoric material 20. In order to target a broad spectrum of light, a relative center or target peak wavelength for the broad spectrum may be set at 535 nm. In this regard, the median particle size of the second plurality of light-altering particles 28-2 may be set at 220 nm, or in a range from 190 nm to 240 nm. As such, the median particle sizes of the first and second light-altering particles 28-1, 28-2 may differ by at least 40 nm, or in a range from 40 nm to 100 nm in certain embodiments. With other wavelength configurations of the LED chip 12 and the lumiphoric material 20, the median particle sizes of the first and second light-altering particles 28-1, 28-2 may differ in other amounts, such as by at least 30 nm, or by at least 15 nm, or in a range from 30 nm to 100 nm, or in a range from 15 nm to 100 nm. In certain embodiments, the first and second light-altering particles 28-1, 28-2 may include any of the materials as previously described, such as one or more of fused silica, fumed silica, zinc oxides, tantalum oxides, zirconium oxides, niobium oxides, yttrium oxides, alumina, glass beads, and $TiO_2$ that are suspended or embedded within a binder such as silicone. In certain embodiments, the first and second light-altering particles 28-1, 28-2 may both comprise a same material (e.g., both comprise $TiO_2$) with the differences between the two being the median particle size.

As further illustrated in FIG. 2, the wavelength conversion element formed by the lumiphoric material 20 and the superstrate 22 may have a lateral dimension that is larger than a lateral dimension of the LED chip 12, thereby forming an overhang portion 32 that extends past the LED chip 12. In certain arrangements, the first sub-region 26-1 is configured between the overhang portion 32 and the submount 14 to redirect light from the LED chip 12 that may propagate there. As such, as least some light from the LED chip 12 may be redirected by the first sub-region 26-1 into the lumiphoric material 20 without traveling back through the LED chip 12. As further illustrated in FIG. 2, the second sub-region 26-2 may be provided above the first sub-region 26-1 and along peripheral edges of the lumiphoric material 20 and the superstrate 22. The wavelength conversion element formed by the lumiphoric material 20 and the superstrate 22 may be mounted above the LED chip 12 before or after the light-altering material 26 is formed. For example, the wavelength conversion element may be mounted to the LED chip 12, followed by separately dispensing the first and second sub-regions 26-1, 26-2 of the light-altering material 26. In another example, the light-altering material 26 may be formed first and peripheral edges of the wavelength conversion element may be pressed at least partially into the light-altering material 26 during mounting. In this manner, peripheral edges of the lumiphoric material 20 and optionally the superstrate 22 may be at least partially embedded within the light-altering material 26 and particularly within the second sub-region 26-2. In further embodiments, peripheral edges of the lumiphoric material 20 and optionally the superstrate 22 may be fully embedded within the light-altering material 26. By positioning the lumiphoric material 20 between the superstrate 22 and the LED chip 12 and laterally surrounded by the light-altering material 20, the lumiphoric material 20 may be protected from degradation related to environmental exposure.

As previously described, the light-altering material 26 (including each of the sub-regions 26-1, 26-2) may be loaded with a weight ratio of the light-altering particles 28-1, 28-2 to a binder that is in a range from 1:1 to about 2:1. In this regard, the light-altering material 26 may serve as a de facto reflector around a perimeter of the LED chip 12 that effectively redirects and shapes a light emission direction and pattern for the LED package 30. In different embodiments, a height of the light-altering material 26 relative to a height of the LED chip 12 may vary depending on the desired emission pattern for the LED package 30. In certain embodiments, the height of the light-altering material 26 may be the same or similar as the height of the LED chip 12. In other embodiments and as configured in FIG. 2, the height of the light-altering material 26 may be greater than the height of the LED chip 12 to alter the emission pattern of the LED package 30, but not so great that the light-altering material 26 would block light emissions in the desired direction. For example, the height of the light-altering material 26 may be no more than two times, or no more than 1.5 times, or no more than 1.3 times greater than the height of the LED chip 12. For comparison purposes, the above-described heights may be measured in a direction perpendicular to the submount 14.

Figure 3:
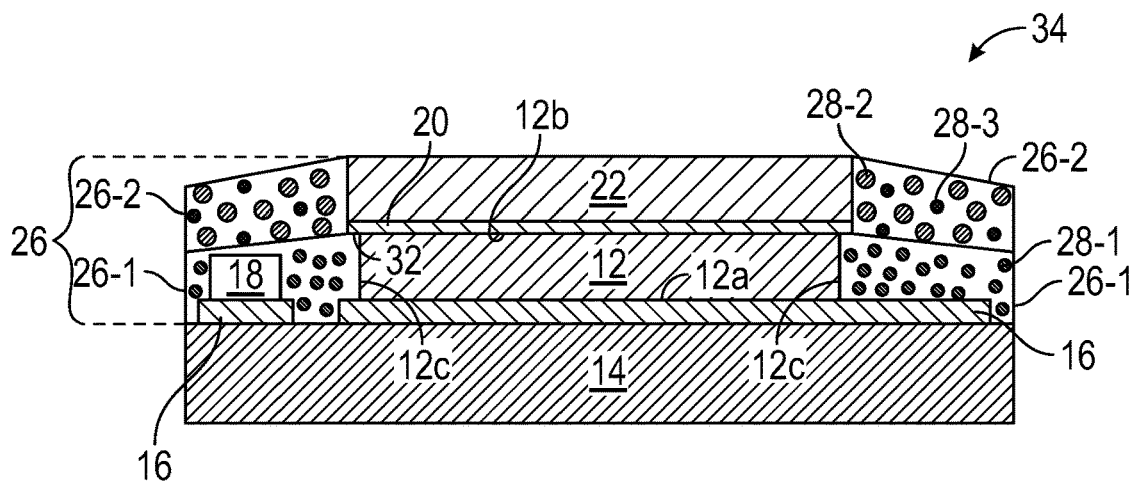
FIG. 3 is a cross-sectional view of an LED package that is similar to the LED package of FIG. 2 but where the second sub-region further includes a third plurality of light-altering particles.

FIG. 3 is a cross-sectional view of an LED package 34 that is similar to the LED package 30 of FIG. 2 but where the second sub-region 26-2 further includes a third plurality of light-altering particles 28-3. In various embodiments, the lumiphoric material 20 may include mixtures of phosphors that provide different peak wavelengths of light, such as one or more combinations of red, yellow, and green phosphor materials. In such embodiments, the second sub-region 26-2 may comprise a mixture with different median particle sizes targeted to each of the phosphor materials present. By way of example, the lumiphoric material 20 may be configured with a mixture of phosphors that respectively provide peak wavelengths of 650 nm and 550 nm, and the second sub-region 26-2 may accordingly comprise the second plurality of light-altering particles 28-2 and the third plurality of light-altering particles 28-3 that are provided in two different corresponding ranges (e.g., 197 nm to 207 nm for the 650 nm phosphor and 165 nm to 185 nm for the 550 nm phosphor). In certain embodiments, the third plurality of light-altering particles 28-3 may have the same median particle size as the first plurality of light-altering particles 28-1. Such an arrangement may further improve light redirecting efficiency as some light having the first peak wavelength from the LED chip 12 may pass through the lumiphoric material 20 without conversion. Additionally, the lumiphoric material 20 may also include some phosphor materials that provide emissions close to the first peak wavelength. As such, the second sub-region 26-2 may be configured with different groups of light-altering particles 28-2, 28-3 that are tailored to redirect different peak wavelengths of light.

Figure 4:
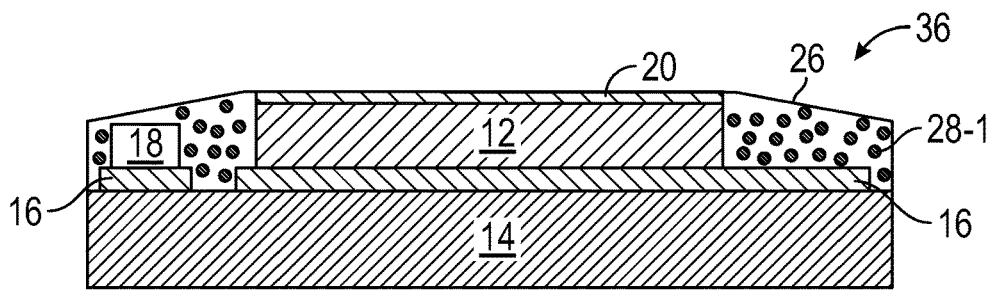
FIG. 4 is a cross-sectional view of an LED package that is similar to the LED package of FIG. 2 but does not include the second sub-region.

FIG. 4 is a cross-sectional view of an LED package 36 that is similar to the LED package 30 of FIG. 2 but does not include the second sub-region 26-2. In certain embodiments the lumiphoric material 20 may be arranged as a thin coating on the LED chip 12 or as a thin pre-formed structure that is mounted on the LED chip 12. In such configurations, the lumiphoric material 20 may embody a wavelength conversion element without a separate superstrate. In this manner, an amount of laterally traversing light from the lumiphoric material 20 to the light-altering material 26 may be reduced. Accordingly, the light-altering material 26 may only need to include the first plurality of light-altering particles 28-1 tailored to redirect light having the first peak wavelength of the LED chip 12. In this manner, the light-altering material 20 may be configured to redirect wavelengths of light from the LED chip 12 with improved efficiency toward a primary emission direction of the LED package 36, where the light may pass through the lumiphoric material 20.

Figure 5:
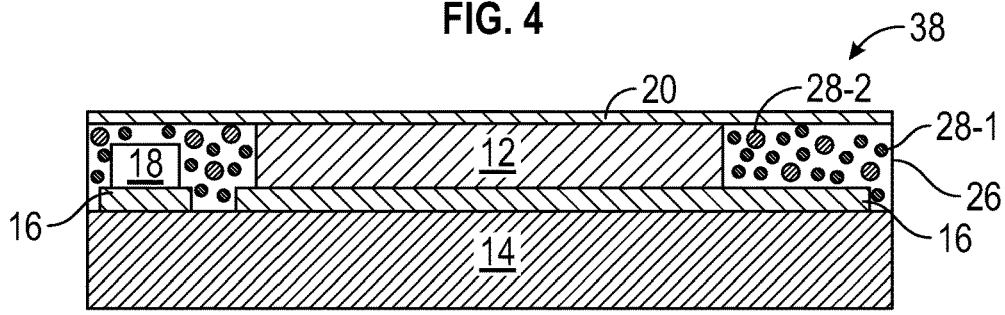
FIG. 5 is a cross-sectional view of an LED package that is similar to the LED package of FIG. 4 but where the lumiphoric material is also arranged on at least a portion of the light-altering material.

FIG. 5 is a cross-sectional view of an LED package 38 that is similar to the LED package 36 of FIG. 4 but where the lumiphoric material 20 is also arranged on at least a portion of the light-altering material 26. As illustrated, the lumiphoric material 20 may cover the LED chip 12 and portions of the light-altering material 26. In certain embodiments, the lumiphoric material 20 may entirely cover the light-altering material 26. In such arrangements, some light converted by the lumiphoric material 20 may propagate backwards in a direction toward the submount 14. In this regard, the light-altering material 26 may comprise the first plurality of light-altering particles 28-1 tailored to the wavelength of the LED chip 12 and the second plurality of light-altering particles 28-2 tailored to the wavelength of the lumiphoric material 20. As with the LED package 36 of FIG. 5, the lumiphoric material 20 of the LED package 38 may embody a wavelength conversion element that is deposited on the LED package 38 or attached to the LED package 38 as a pre-formed structure.

Figure 6:
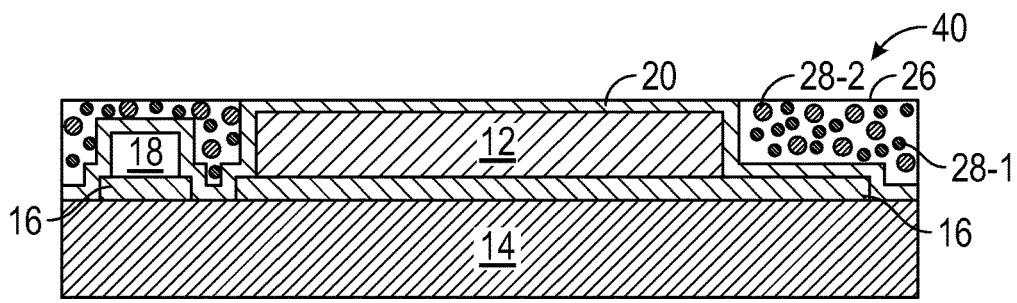
FIG. 6 is a cross-sectional view of an LED package that is similar to the LED package of FIG. 5 but where the lumiphoric material is arranged on the LED chip and between portions of the light-altering material and the submount.

FIG. 6 is a cross-sectional view of an LED package 40 that is similar to the LED package 38 of FIG. 5 but where the lumiphoric material 20 is arranged on the LED chip 12 and between portions of the light-altering material 26 and the submount 14. In such configurations, the lumiphoric material 20 may be formed on the LED package 40 before the light-altering material 26 is provided. For example, the lumiphoric material 20 may be conformally deposited (e.g., as a spray coating) on the LED chip 12, on the electrical overstress device 18, on portions of the electrical traces 16, and on uncovered portions of the submount 14. The light-altering material 26 may then be formed around a perimeter of the LED chip 12 and on portions of the lumiphoric material 20. As with the embodiments of FIG. 5, the light-altering material 26 of FIG. 6 may receive light from both the LED chip 12 and the lumiphoric material 20. In this regard, the light-altering material 26 may comprise the first plurality of light-altering particles 28-1 tailored to the wavelength of the LED chip 12 and the second plurality of light-altering particles 28-2 tailored to the wavelength of the lumiphoric material 20.

While the previously described embodiments include arrangements of lumiphoric materials within LED packages, the principles of the present disclosure are applicable to LED packages that do not include lumiphoric materials. Examples of which include single color LED packages configured to provide one of blue, green, red, or other single color emissions. For single color LED packages, a light-altering material with light-altering particles tailored to redirect wavelengths of light from the LED chip may be provided as previously described without the need for other light-altering particles. In further embodiments, an LED package may include arrangements of single color LED chips and LED chips arranged with lumiphoric materials for wavelength conversion. In such arrangements, the single color LED chips may be laterally surrounded by light-altering particles tailored to just to the single color emission wavelengths while the other LED chips may be laterally surrounded by light-altering particles tailed to at least two different wavelengths as previously described.

Figure 7:
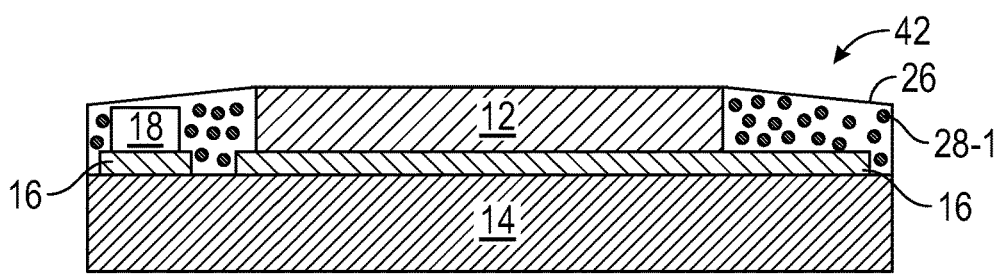
FIG. 7 is a cross-sectional view of an LED package that is similar to the LED package of FIG. 4 but without the lumiphoric material arranged to convert at least a portion of light from the LED chip.
Figure 8:
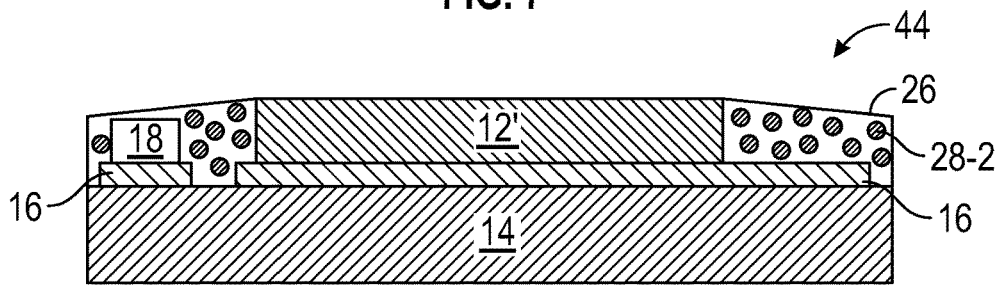
FIG. 8 is a cross-sectional view of an LED package that is similar to the LED package of FIG. 7, but includes an LED chip that emits a different wavelength of light than the LED chip of FIG. 7.

FIG. 7 is a cross-sectional view of an LED package 42 that is similar to the LED package 36 of FIG. 4 but without the lumiphoric material 20 arranged to convert at least a portion of light from the LED chip 12. In this regard, the LED package 42 may be configured as a single color emitter. By way of example, the LED chip 12 may be configure to emit primarily blue emissions with a peak wavelength of 450 nm. As such, to provide increased light redirection characteristics, the light-altering material 26 may comprise the light-altering particles 28-1 with a median particle size in a range from 133 nm to 153 nm. By way of another example, FIG. 8 is a cross-sectional view of an LED package 44 that is similar to the LED package 42 of FIG. 7, but includes an LED chip 12' that emits a different wavelength than the LED chip 12 of FIG. 7. For example, the LED chip 12' may be configure to emit primarily red emissions with a peak wavelength of 650 nm. In order to provide increased light redirection characteristics, the light-altering material 26 may accordingly comprise the light-altering particles 28-2 with a median particle size in a range from 197 nm to 217 nm. Besides blue or red emissions, it is understood the LED chip 12 of FIG. 7 and the LED chip 12' of FIG. 8 may be configured to emit other colors of light, such as green, cyan, lime, amber, and violet, depending on the application. In various applications, the single color arrangements of the light-altering material 26 and LED chips 12, 12' illustrated in FIGS. 7 and 8 may be provided in common LED packages that also include other LED chips arranged with lumiphoric materials and other light-altering materials according to any the previously described embodiments.

Figure 9A:
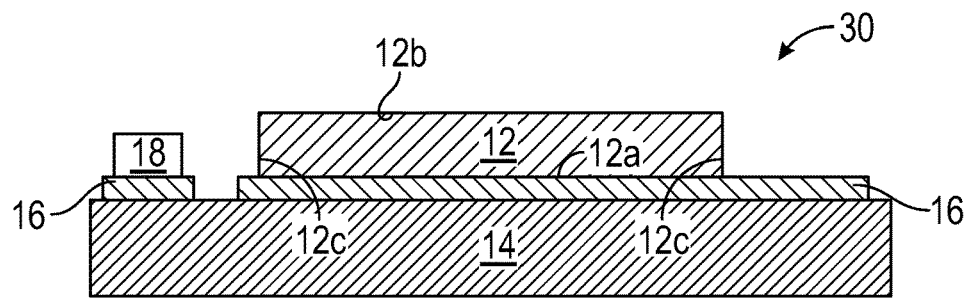
FIG. 9A is a cross-sectional view of the LED package of FIG. 2 at a fabrication step after the LED chip is mounted on the submount.
Figure 9B:
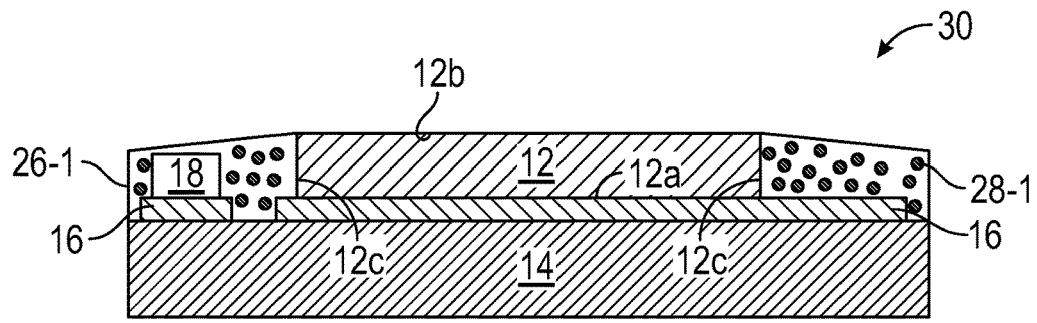
FIG. 9B is a cross-section view of the LED package of FIG. 9A at a fabrication step after a first sub-region of the light-altering material is formed.
Figure 9C:
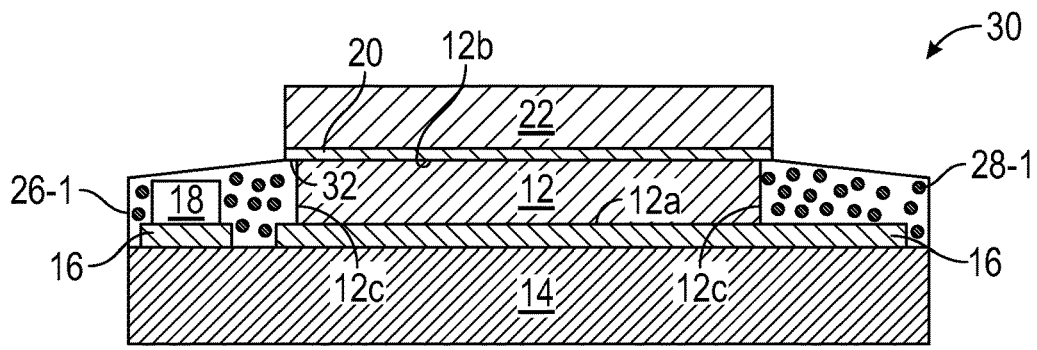
FIG. 9C is a cross-sectional view of the LED package of FIG. 9B at a fabrication step after a wavelength conversion element is mounted over the LED chip.
Figure 9D:
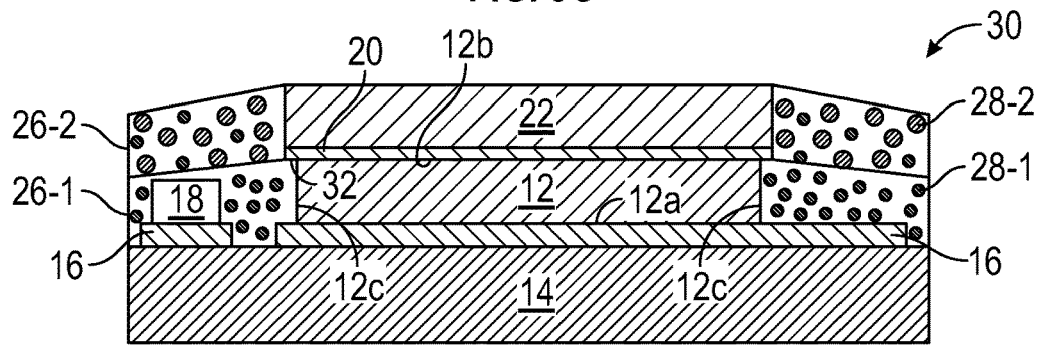
FIG. 9D is a cross-sectional view of the LED package of FIG. 9C at a fabrication step after a second sub-region with a second plurality of light-altering particles is formed on the first sub-region.

Light-altering materials according to the present disclosure may be formed in LED packages according to various manufacturing steps. Once such sequence is provided in FIGS. 9A-9D. By way of example, FIGS. 9A-9D are cross-sectional views of the LED package 30 of FIG. 2 at various fabrication steps. In FIG. 9A, the LED chip 12 is mounted on the submount 14 and electrically coupled with one or more of the electrical traces 16. When present, the electrical overstress device 18 may also be mounted and electrically coupled with one or more of the electrical traces 16. As illustrated in FIG. 9B, the first sub-region 26-1 of the light-altering material 26 is formed on the submount 14 and around sidewalls 12c of the LED chip 12. The first sub-region 26-1 may include the first plurality of light-altering particles 28-1 as previously described. In certain embodiments, the first sub-region 26-1 may be formed by a first dispensing step. In FIG. 9C, the wavelength conversion element formed by the lumiphoric material 20 and the superstrate 22, when present, is mounted over the LED chip 12 such that the lumiphoric material 20 is arranged to receive light from the LED chip 12. The wavelength conversion element may be attached to the LED chip 12 with a transparent adhesive, such as silicone. In order to provide sufficient alignment tolerances with the LED chip 12 for wavelength conversion, the lumiphoric material 20 and the superstrate 22 may have a lateral dimension that is greater than a lateral dimension of the LED 12 as measured parallel to the submount 14. In this manner, the overhang portion 32 is formed over portions of the first sub-region 26-1. In FIG. 9D, the second sub-region 26-2 with the second plurality of light-altering particles 28-2 is formed on the first sub-region 26-1 and around peripheral edges of the lumiphoric material 20 and superstrate 22. The second sub-region 26-2 may also be formed by dispensing. Afterwards, the first and second sub-regions 26-1, 26-2 may be cured in place. In alternative embodiments, the first sub-region 26-1 may be cured before progressing to FIG. 9C.

FIG. 10 is a cross-sectional view of an LED package 46 that includes an arrangement of the light-altering material 26 with first and second LED chips 12-1, 12-2. While the LED package 46 is shown with two LED chips 12-1, 12-2 for illustrative purposes, the LED package 46 may include any number of LED chips without deviating from the principles disclosed. As further illustrated, separate lumiphoric materials 20-1, 20-2 and superstrates 22-1, 22-2 are respectively provided over the LED chips 12-1, 12-2. Notably, the first sub-region 26-1 may be formed between the LED chips 12-1, 12-2, and the second sub-region 26-2 may be formed between the lumiphoric materials 20-1, 20-2 and the superstrates 22-1, 22-2. In this manner, crosstalk of light between the LED chips 12-1, 12-2 and crosstalk of light between the lumiphoric materials 20-1, 20-2 may be reduced with improved efficiency. In certain embodiments, the LED chips 12-1, 12-2 may both be configured to emit a same or similar wavelength while in other embodiments, the LED chips 12-1, 12-2 may be configured to emit different wavelengths of light. If the LED chips 12-1, 12-2 emit different wavelengths, the first light-altering particles 28-1 may be tailored to the peak wavelength of one of the LED chips 12-1, 12-2. Alternatively, the first light-altering particles 28-1 may be tailored to a peak wavelength that corresponds to a value that is between the peak wavelengths of the LED chips 12-1, 12-2.

FIG. 11 is a cross-sectional view of an LED package 48 that is similar to the LED package 46 of FIG. 10, except that a single lumiphoric material 20 and superstrate 22 are provided over both of the LED chips 12-1, 12-2. As illustrated, the first sub-region 26-1 of the light-altering material 26 may be formed around a perimeter of the LED chips 12-1, 12-2 as well as between the LED chips 12-1, 12-2, while the second sub-region 26-2 is provided around peripheral edges of the lumiphoric material 20 and the superstrate 22. In this manner, the first light-altering particles 28-1 are positioned in areas that may receive higher amounts of light having the wavelengths of the LED chips 12-1, 12-2 while the second light-altering particles 28-2 are positioned in areas that may receive higher amounts of light having wavelengths that correspond with the lumiphoric material 20.

While the previously described embodiments are provided with examples related to light-altering particles with a median particle size that is determined based on a targeted peak wavelength of light, the principles of the present disclosure could equally be applicable to determining a median particle size based on a targeted dominant wavelength of light.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount;
   at least one LED chip on the submount, wherein the at least one LED chip comprises a first face mounted to the submount, a second face that generally opposes the first face, and a sidewall between the first face and the second face;
   a lumiphoric material on the second face of the at least one LED chip; and
   a light-altering material on the submount and arranged around a perimeter of the at least one LED chip, the light-altering material comprising:
      a first sub-region arranged along the sidewall of the at least one LED chip, the first sub-region comprising a first plurality of light-altering particles with a first median particle size; and
      a second sub-region arranged above the first sub-region, the second sub-region comprising a second plurality of light-altering particles with a second median particle size that is larger than the first median particle size and a third plurality of light-altering particles with a third median particle size that is different than the second median particle size.

2. The LED package of claim 1, wherein the first median particle size is in a range from 130 nm to 170 nm.

3. The LED package of claim 1, wherein the second median particle size is in a range from 240 nm to 350 nm.

4. The LED package of claim 1, wherein the second median particle size is in a range from 190 nm to 240 nm.

5. The LED package of claim 1, wherein the third median particle size is the same as the first median particle size.

6. The LED package of claim 1, wherein the third median particle size is different than the first median particle size and the second median particle size.

7. The LED package of claim 1, wherein the at least one LED chip comprises a first height measured in a direction perpendicular to the submount, the light-altering material comprises a second height measured in a direction perpendicular to the submount, and the second height is no more than two times greater than the first height.

8. The LED package of claim 7, wherein the second height is no more than 1.3 times greater than the first height.

9. The LED package of claim 1, wherein the second sub-region is arranged along a peripheral edge of the lumiphoric material.

10. The LED package of claim 1, wherein the lumiphoric material is part of a wavelength conversion element that includes a light-transmissive superstrate.

11. The LED package of claim 1, wherein peripheral edges of the lumiphoric material are at least partially embedded within the light-altering material.

12. The LED package of claim 1, wherein the first median particle size differs from the second median particle size by at least 40 nm.

13. The LED package of claim 1, wherein the first median particle size differs from the second median particle size in a range from 40 nm to 100 nm.

14. The LED package of claim 1, wherein the at least one LED chip comprises a first LED chip and a second LED chip, and a portion of the first sub-region is arranged between the first LED chip and the second LED chip.

15. The LED package of claim 14, wherein the lumiphoric material extends over the first LED chip and the second LED chip.

16. The LED package of claim 14, wherein the lumiphoric material is a first lumiphoric material that is arranged over the first LED chip, the LED package further comprises a second lumiphoric material that is arranged over the second LED chip, and a portion of the second sub-region is arranged between the first lumiphoric material and the second lumiphoric material.

17. A light-emitting diode (LED) package comprising:
a submount;
at least one LED chip on the submount, wherein the at least one LED chip comprises a first face mounted to the submount, a second face that generally opposes the first face, and a sidewall between the first face and the second face; and
a light-altering material on the submount and arranged around a perimeter of the at least one LED chip to form a reflector for the sidewall of the at least one LED chip, the light-altering material comprising a plurality of light-altering particles with a median particle size that is determined based on a peak wavelength of light emissions provided by the at least one LED chip, wherein the light-altering material comprises at least one region that includes a first plurality of light-altering particles with a first median particle size and a second plurality of light-altering particles with a second median particle size that is different than the first median particle size.

18. The LED package of claim 17, wherein the median particle size is in a range from 130 nm to 170 nm.

19. The LED package of claim 17, wherein the at least one LED chip comprises a first height measured in a direction perpendicular to the submount, the light-altering material comprises a second height measured in a direction perpendicular to the submount, and the second height is no more than two times greater than the first height.

20. The LED package of claim 17, further comprising a lumiphoric material on the second face of the at least one LED chip such that peripheral edges of the lumiphoric material are at least partially embedded within the light-altering material.

21. The LED package of claim 17, further comprising a lumiphoric material on the second face of the at least one LED chip and on the light-altering material such that at least a portion of the light-altering material is between the lumiphoric material and the submount.

22. The LED package of claim 17, further comprising a lumiphoric material on the second face of the at least one LED chip and on a surface of the submount that is adjacent the at least one LED chip such that at least a portion of the lumiphoric material is between the light-altering material and the submount.

23. A method comprising:
providing at least one light-emitting diode (LED) chip on a submount, the at least one LED chip comprising a first face mounted to the submount, a second face that generally opposes the first face, and a sidewall between the first face and the second face;
providing a lumiphoric material on the second face of the at least one LED chip; and
forming a light-altering material on the submount and arranged along the sidewall of the at least one LED chip, the light-altering material comprising:
a plurality of first light-altering particles with a first median particle size that is determined based on a peak wavelength of light emissions provided by the at least one LED chip;
a first sub-region arranged along the sidewall of the at least one LED chip, the first sub-region comprising the first plurality of light-altering particles; and
a second sub-region arranged above the first sub-region, the second sub-region comprising a second plurality of light-altering particles with a second median particle size that is larger than the first median particle size and a third plurality of light-altering particles with a third median particle size that is different than the second median particle size.

24. The method of claim 23, wherein the second median particle size is determined based on a peak wavelength of light emissions provided by the lumiphoric material.

25. The method of claim 24, wherein the first median particle size differs from the second median particle size in a range from 40 nanometers (nm) to 100 nm.

26. The method of claim 24, wherein the first sub-region and the second sub-region are formed by different dispensing steps and the first sub-region and the second sub-region are cured at the same time.

27. The method of claim 24, wherein the first sub-region and the second sub-region are formed by different dispensing steps and the first sub-region is cured before the second sub-region is formed.

* * * * *